United States Patent
Zhang et al.

(10) Patent No.: US 12,349,595 B2
(45) Date of Patent: Jul. 1, 2025

(54) LITHIUM NIOBATE SEMICONDUCTOR STRUCTURE AND MANUFACTURING METHOD THEREOF

(71) Applicant: NANKAI UNIVERSITY, Tianjin (CN)

(72) Inventors: Guoquan Zhang, Tianjin (CN); Yuezhao Qian, Tianjin (CN); Yuchen Zhang, Tianjin (CN); Jingjun Xu, Tianjin (CN)

(73) Assignee: NANKAI UNIVERSITY, Tianjin (CN)

( * ) Notice: Subject to any disclaimer, the term of this patent is extended or adjusted under 35 U.S.C. 154(b) by 511 days.

(21) Appl. No.: 17/771,351

(22) PCT Filed: Dec. 28, 2020

(86) PCT No.: PCT/CN2020/140174
§ 371 (c)(1),
(2) Date: Apr. 22, 2022

(87) PCT Pub. No.: WO2022/121014
PCT Pub. Date: Jun. 16, 2022

(65) Prior Publication Data
US 2023/0165152 A1 May 25, 2023

(30) Foreign Application Priority Data
Dec. 10, 2020 (CN) .......................... 202011438154.0

(51) Int. Cl.
*H10N 30/853* (2023.01)
*H10N 30/01* (2023.01)

(52) U.S. Cl.
CPC ......... *H10N 30/8542* (2023.02); *H10N 30/01* (2023.02)

(58) Field of Classification Search
CPC .. H10N 30/8542; H10N 30/01; H10N 30/045; H10N 50/01; H10N 50/85; H10N 50/10
(Continued)

(56) References Cited

U.S. PATENT DOCUMENTS

| 2007/0024162 A1* | 2/2007 | Shibata ................ H10N 30/704 310/358 |
| 2008/0087632 A1* | 4/2008 | Yang ..................... G02F 1/3558 216/24 |

(Continued)

FOREIGN PATENT DOCUMENTS

| CN | 101165228 A | 4/2008 |
| CN | 101308311 A | 11/2008 |

(Continued)

OTHER PUBLICATIONS

Shandong University, Thesis for Master Degree: Periodically Poling of Single-Crystal Lithium Niobate Thin Films and Its Application; Apr. 10, 2017; Yunpeng Jiang; 73 pages.
(Continued)

*Primary Examiner* — Duy T Nguyen

(57) ABSTRACT

A lithium niobate semiconductor structure includes: a first lithium niobate material layer, a second lithium niobate material layer and a third lithium niobate material layer. A polarization direction of a ferroelectric domain of the first lithium niobate material layer is a first direction. The second lithium niobate material layer is spaced apart from the first lithium niobate material layer, and a polarization direction of a ferroelectric domain of the second lithium niobate material layer is the first direction. The third lithium niobate material layer is sandwiched between the first lithium niobate material layer and the second lithium niobate material layer, and a polarization direction of a ferroelectric domain of the third lithium niobate material layer is a second direction; the first direction is opposite to the second direction.

11 Claims, 6 Drawing Sheets

(58) Field of Classification Search
USPC .......................................................... 257/428
See application file for complete search history.

(56) References Cited

U.S. PATENT DOCUMENTS

| | | | | |
|---|---|---|---|---|
| 2012/0133210 | A1* | 5/2012 | Moon | H10N 10/00 |
| | | | | 136/224 |
| 2014/0285067 | A1* | 9/2014 | Li | H10N 30/306 |
| | | | | 310/333 |
| 2014/0312385 | A1* | 10/2014 | Sluka | G11C 11/22 |
| | | | | 257/183.1 |
| 2018/0096717 | A1* | 4/2018 | Jiang | G11C 11/2273 |

FOREIGN PATENT DOCUMENTS

| | | | | |
|---|---|---|---|---|
| CN | 101373282 | A | | 2/2009 |
| CN | 102122105 | A | | 7/2011 |
| CN | 102321920 | A | | 1/2012 |
| CN | 105655342 | A | | 6/2016 |
| CN | 106283194 | A | | 1/2017 |
| CN | 110670134 | A | | 1/2020 |
| CN | 111430533 | A | | 7/2020 |
| JP | H11281839 | A | * 10/1999 | ........... G02F 1/3558 |
| WO | 2017177376 | A1 | | 10/2017 |

OTHER PUBLICATIONS

CN: Chinese International Search Report of PCT/CN2020/140174 (related application); Aug. 12, 2021; 4 pages (Chinese Translation only).

* cited by examiner

LITHIUM NIOBATE SEMICONDUCTOR STRUCTURE AND MANUFACTURING METHOD THEREOF

CROSS-REFERENCE TO RELATED APPLICATIONS

This application is a U.S. National Phase application submitted under 35 U.S.C. § 371 of Patent Cooperation Treaty application serial no. PCT/CN2020/140174, filed Dec. 28, 2020, and entitled LITHIUM NIOBATE SEMICONDUCTOR STRUCTURE AND MANUFACTURING METHOD THEREOF, which claims priority to Chinese Patent Application with No. 202011438154.0, entitled "Lithium Niobate Semiconductor Structure and Manufacturing Method Thereof", and filed on Dec. 10, 2020. Patent Cooperation Treaty application serial no. PCT/CN2020/140174 and Chinese patent application serial no. 202011438154.0, are incorporated herein by reference.

TECHNICAL FIELD

The present disclosure relates to the field of semiconductor technology, and particularly to a lithium niobate semiconductor structure and a manufacturing method thereof.

BACKGROUND

Lithium niobate is a material with excellent characteristics in terms of acousto-optic modulation, nonlinear optics, and electro-optic modulation, and is referred to as "silicon of photonics".

The lithium niobate has very good opto-electric properties, but it is rarely used in electronic devices and integrated circuits. A main reason is that the lithium niobate itself is of good insulation. In the traditional technology, the conductivity of lithium niobate can be improved by adjusting the defect energy level of the lithium niobate through doping. For example, the conductivity of magnesium-doped lithium niobate can reach $10^{-12}$ $\Omega^{-1}$ $cm^{-1}$. However, the conductivity of magnesium-doped lithium niobate is still much lower than that of a semiconductor due to the restriction of its forbidden-band width thereof.

In recent years, it has been shown that the conductive domain wall of lithium niobate has better conducting properties than the bulk domain itself. By adjusting the polarization directions of the bulk domains on both sides of the domain wall, the carrier type of the domain wall can be controlled. However, the carrier type of the domain wall obtained by the traditional method for manufacturing the lithium niobate domain wall is usually the n-type, and there are few reports on the manufacture of the p-type conductive domain wall. In addition, a semiconductor structure with rectifying characteristics formed by the combination of the p-type lithium niobate domain wall and the n-type lithium niobate domain wall has not been realized, so that the application of lithium niobate in semiconductor devices still has a bottleneck.

SUMMARY

In view of this, it is necessary to provide a lithium niobate semiconductor structure and a manufacturing method thereof.

In an embodiment, a lithium niobate semiconductor structure is provided, including:

a first lithium niobate material layer, a polarization direction of a ferroelectric domain of the first lithium niobate material layer being a first direction;

a second lithium niobate material layer, spaced apart from the first lithium niobate material layer, and a polarization direction of a ferroelectric domain of the second lithium niobate material layer being the first direction; and a third lithium niobate material layer, sandwiched between the first lithium niobate material layer and the second lithium niobate material layer, and a polarization direction of a ferroelectric domain of the third lithium niobate material layer being a second direction, the first direction being opposite to the second direction.

In an embodiment, a lithium niobate semiconductor device is provided, including:

a substrate;

a lithium niobate material film fitted to a surface of the substrate, the lithium niobate material film including:

a first lithium niobate material layer fitted to the surface of the substrate, a polarization direction of a ferroelectric domain of the first lithium niobate material layer being a first direction;

a second lithium niobate material layer fitted to the surface of the substrate and spaced apart from the first lithium niobate material layer, a polarization direction of a ferroelectric domain of the second lithium niobate material layer being the first direction;

a third lithium niobate material layer fitted to the surface of the substrate and sandwiched between the first lithium niobate material layer and the second lithium niobate material layer, a polarization direction of a ferroelectric domain of the third lithium niobate material layer being a second direction, and the first direction being opposite to the second direction.

In an embodiment, a method for manufacturing a lithium niobate semiconductor structure is provided, including:

S100: providing a lithium niobate material film, a polarization direction of a ferroelectric domain of the lithium niobate material film being a first direction;

S200: providing a first electrode layer and a second electrode layer spaced apart from each other on a surface of the lithium niobate material film;

S300: applying a voltage to the first electrode layer and the second electrode layer, such that the polarization direction of the ferroelectric domain of the lithium niobate material film between the first electrode layer and the second electrode layer is reversed to a second direction, the second direction being opposite to the first direction.

The embodiment of the present disclosure provides a method for manufacturing a lithium niobate semiconductor structure. The first electrode layer and the second electrode layer spaced apart from each other are provided on the surface of the lithium niobate material film extending in the polarization direction of the ferroelectric domain. Then, a voltage is applied to the first electrode layer and the second electrode layer so that the polarization direction of the ferroelectric domain of the lithium niobate material film between the first electrode layer and the second electrode layer is reversed, thereby obtaining the lithium niobate semiconductor structure. In the lithium niobate semiconductor structure, the first lithium niobate material layer, the second lithium niobate material layer, and the third lithium niobate material layer each has a single domain structure. The first lithium niobate material layer and the second lithium niobate material layer are spaced apart from each other, and the polarization direction of the ferroelectric domain is the first direction. The third lithium niobate material layer is provided between the first lithium niobate material layer and the second lithium niobate material layer. The polarization direction of the ferroelectric domain in the third lithium niobate material layer is the second direction. Since the first direction is opposite to the second direction, a first interface ferroelectric domain wall is formed at an interface of the first lithium niobate material layer and the third lithium niobate material layer. A second interface ferroelectric domain wall is formed at an interface of the third lithium niobate material layer and the second lithium niobate material layer. A polarity of a conducting carrier of the first interface ferroelectric domain wall is different from a polarity of a conducting carrier of the second interface ferroelectric domain wall, so that the lithium niobate semiconductor structure has semiconductor characteristics. Therefore, the lithium niobate semiconductor structure provided in the present disclosure can have semiconductor properties while having good optical properties, and can be applied to semiconductor devices.

BRIEF DESCRIPTION OF THE DRAWINGS

In order to more clearly describe the technical solution in the embodiments of the present disclosure or in the traditional technology, the accompanying drawings needing to be used in the description of the embodiments or the traditional technology will be briefly introduced below. Apparently, the drawings in the following description are merely some embodiments of the present disclosure. Those of ordinary skill in the art can make other drawings based on these drawings without any creative work.

DESCRIPTION OF REFERENCE SIGNS

Figure 1:
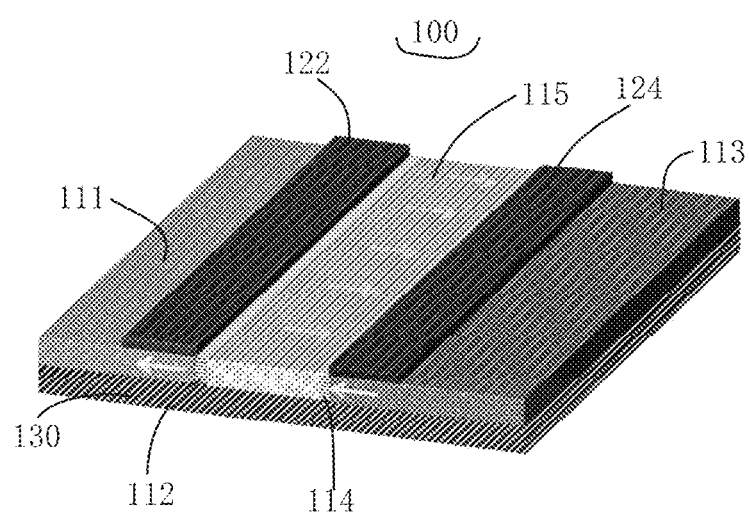
FIG. 1 is a schematic diagram illustrating a three-dimensional structure of a semiconductor structure according to an embodiment of the disclosure.

100, lithium niobate semiconductor structure; 111, first lithium niobate material layer; 113, second lithium niobate material layer; 115, third lithium niobate material layer; 112, first conductive domain wall layer; 114, second conductive domain wall layer; 110, lithium niobate material film; 122, first electrode layer; 124, second electrode layer; 125, first auxiliary electrode layer; 127, second auxiliary electrode layer; 130, substrate.

DETAILED DESCRIPTION

In order to facilitate the understanding of the disclosure, the disclosure will be more comprehensively described with reference to the accompanying drawings. The preferred embodiments of the disclosure are shown in the accompanying drawings. However, this disclosure can be implemented in many different forms and is not limited to the embodiments described herein. Rather, the purpose of providing these embodiments is to make the disclosure more thorough and comprehensive.

Unless otherwise defined, all technical and scientific terms used herein have the same meaning as commonly understood by those skilled in the technical field of the present disclosure. The terms used in the specification of the disclosure herein are only for the purpose of describing specific embodiments, and are not intended to limit the disclosure.

It should be understood that when an element or layer is referred to as being "on", "adjacent to", "connected to" or "coupled to" other elements or layers, it can be directly on, or adjacent to, or connected to or coupled to the other elements or layers. Alternatively, there may be an intermediate element or layer. In contrast, when an element is referred to as being "directly on", "directly adjacent to", "directly connected to" or "directly coupled to" other elements or layers, there is no intermediate element or layer. It should be understood that although the terms first, second, third, etc., can be adopted to describe various elements, components, regions, layers, doping types and/or portions, these elements, components, regions, layers, doping types and/or portions should not be limited by these terms. These terms are only utilized to distinguish one element, component, region, layer, doping type or section from another element, component, region, layer, doping type or section. Therefore, without departing from the teaching of the present disclosure, the first element, component, region, layer, doping type or portion discussed herein may be represented as a second element, component, region, layer or portion. For example, the first doping type can be changed to the second doping type, and similarly, the second doping type can be changed to the first doping type. The first doping type is different from the second doping type. For example, the first doping type can be p-type and the second doping type can be n-type, or the first doping type can be n-type and the second doping type can be p-type.

Spatial relationship terms such as "under", "below", "beneath", "lower", "above", "over", etc., can be utilized to describe the relationship between one element or feature and other elements or features shown in the figures. It should be understood that in addition to the orientations shown in the figures, the spatial relationship terms also include different orientations of devices in use and operation. For example, if the device in the figures is turned over, elements or features described as "under" or "below" or "beneath" other elements will be oriented "on" the other elements or features. Therefore, the exemplary terms "under" and "below" can include both orientations of above and below. In addition, the device can also include other orientations (for example, rotated by 90 degrees or other orientations), and the space descriptors used here are explained accordingly.

When used herein, the singular forms of "a", "an" and "the/said" may also include plural forms, unless the context clearly indicates otherwise. It should also be understood that when the terms "consisting" and/or "comprising" are used in this specification, the existence of the described features, integers, steps, operations, elements and/or components can be determined, but one or more other features, integers, steps, operations, elements, components and/or groups are not excluded. Meanwhile, when used herein, the term "and/or" includes any and all combinations of related listed items.

The embodiments of the disclosure are described here with reference to a cross-sectional view which is a schematic diagram of an ideal embodiment (and an intermediate structure) of the present disclosure, so that changes in the shown shape due to, for example, manufacturing technology and/or tolerances can be expected. Therefore, the embodiments of the present disclosure should not be limited to the specific shapes of the regions shown here, but include shape deviations due to, for example, manufacturing techniques. For example, the implanted area shown as a rectangle usually has round or curved features and/or implant concentration gradients at its edges, rather than a binary change from an implanted area to a non-implanted area. Likewise, the buried region formed by the implantation can result in some implantation in a region between the buried region and the surface through which the implantation is performed. Therefore, the regions shown in the figures are schematic in nature, and their shapes do not represent the actual shapes of the regions of the device, and do not limit the scope of the disclosure.

Referring to FIG. 1, the present disclosure provides a lithium niobate semiconductor structure 100, which includes a first lithium niobate material layer 111, a second lithium niobate material layer 113, and a third lithium niobate material layer 115.

The first lithium niobate material layer 111 has a single domain structure. A polarization direction of a ferroelectric domain in the first lithium niobate material layer 111 is a first direction. The second lithium niobate material layer 113 and the first lithium niobate material layer 111 are spaced apart from each other. The second lithium niobate material layer 113 has a single domain structure. The polarization direction of the ferroelectric domain in the second lithium niobate material layer 113 is the first direction. The third lithium niobate material layer 115 is sandwiched between the first lithium niobate material layer 111 and the second lithium niobate material layer 113. The third lithium niobate material layer 115 is adjacent and connected to two conductive domain wall layers which are spaced apart from and opposite to each other. The two conductive domain wall layers spaced apart from and opposite to each other are in contact with the first lithium niobate material layer 111 and the second lithium niobate material layer 113 respectively. The polarization direction of the ferroelectric domain of the third lithium niobate material layer 115 is a second direction. The first direction is opposite to the second direction.

In the lithium niobate semiconductor structure 100, the first lithium niobate material layer 111, the second lithium niobate material layer 113, and the third lithium niobate material layer 115 each has a single domain structure. The first lithium niobate material layer 111 and the second lithium niobate material layer 113 are spaced apart from each other, and the polarization directions of the ferroelectric domains are both the first direction. The third lithium niobate material layer 115 is provided between the first lithium niobate material layer 111 and the second lithium niobate material layer 113. The polarization direction of the ferroelectric domain in the third lithium niobate material layer 115 is the second direction. Since the first direction is opposite to the second direction, a first interface conductive domain wall is formed at an interface between the first lithium niobate material layer 111 and the third lithium niobate material layer 115. A second interface conductive domain wall is formed at an interface between the third lithium niobate material layer 115 and the second lithium niobate material layer 113. A polarity of the conducting carrier of the first interface conductive domain wall is different from a polarity of the conducting carrier of the second interface conductive domain wall, so that the above-mentioned lithium niobate semiconductor structure 100 has semiconductor characteristics.

Therefore, the lithium niobate semiconductor structure 100 provided in the present disclosure can have excellent characteristics of acousto-optic modulation, nonlinear optics, and electro-optical modulation, and meanwhile have semiconductor characteristics. The lithium niobate semiconductor structure 100 can have better applications in semiconductor devices.

It can be understood that the first lithium niobate material layer 111, the second lithium niobate material layer 113, and the third lithium niobate material layer 115 are all thin films. The first lithium niobate material layer 111, the second lithium niobate material layer 113, and the third lithium niobate material layer 115 can be provided on a surface of one substrate. The first lithium niobate material layer 111, the second lithium niobate material layer 113, and the third lithium niobate material layer 115 can be in a complete film structure and fitted to the surface of one substrate.

The first lithium niobate material layer 111 and the third lithium niobate material layer 115 each has a single domain structure. The contact interface between the first lithium niobate material layer 111 and the third lithium niobate material layer 115 can form a conductive domain wall. The second lithium niobate material layer 113 and the third lithium niobate material layer 115 each has a single domain structure. The contact interface between the second lithium niobate material layer 113 and the third lithium niobate material layer 115 can form a conductive domain wall.

In an embodiment, the lithium niobate semiconductor structure 100 further includes a first conductive domain wall layer 112 and a second conductive domain wall layer 114. The first conductive domain wall layer 112 is provided between the first lithium niobate material layer 111 and the third lithium niobate material layer 115. The second conductive domain wall layer 114 is provided between the second lithium niobate material layer 113 and the third lithium niobate material layer 115. The first conductive domain wall layer 112 can be a p-type conductive domain wall. The second conductive domain wall layer 114 can be an n-type conductive domain wall. Therefore, the lithium niobate semiconductor structure 100 can form a pn junction as a basic structure in a semiconductor device.

In an embodiment, the lithium niobate semiconductor structure 100 can further include a first electrode layer 122 and a second electrode layer 124. The first electrode layer 122 and the second electrode layer 124 are spaced apart. The first electrode layer 122 covers the first lithium niobate material layer 111 and is adjacent to the first conductive domain wall layer 112. The second electrode layer 124 covers the second lithium niobate material layer 115 and is adjacent to the second conductive domain wall layer 124. The first electrode layer 122 and the second electrode layer 124 can serve as two electrodes of the lithium niobate semiconductor structure 100.

In an embodiment, the first electrode layer 122 is electrically connected to the first conductive domain wall layer 112. The second electrode layer 124 is electrically connected to the second conductive domain wall layer 114. Through the first electrode layer 122 and the second electrode layer 124 one can apply a voltage between the first conductive domain wall layer 112 and the second conductive domain wall layer 114.

The materials of the first electrode layer 122 and the second electrode layer 124 can be precious metals, such as one of gold, silver, chromium, and palladium. Thicknesses of the first electrode layer 122 and the second electrode layer 124 are 50 nanometers to 800 nanometers. In an embodiment, the materials of the first electrode layer 122 and the second electrode layer 124 are metallic chromium. The thicknesses of the first electrode layer 122 and the second electrode layer 124 are 500 nanometers.

In an embodiment, the lithium niobate semiconductor structure 100 can further include a substrate 130. The first lithium niobate material layer 111, the second lithium niobate material layer 113 and the third lithium niobate material layer 115 are provided on a surface of the substrate 130. The substrate 130 can provide support for the first lithium niobate material layer 111, the second lithium niobate material layer 113, and the third lithium niobate material layer 115. It can be understood that the first lithium niobate material layer 111, the second lithium niobate material layer 113, and the third lithium niobate material layer 115 can be one complete lithium niobate material film provided on the surface of the substrate 130. The substrate 130 can be a flexible substrate or a rigid substrate, which can be selected according to the actual application environment. In an embodiment, the substrate is a silicon dioxide substrate.

In an embodiment, the first lithium niobate material layer 111, the second lithium niobate material layer 113, and the third lithium niobate material layer 115 can be doped lithium niobate material layers. Since the doped lithium niobate material layer is doped with impurity ions, it can have better conductivity. Accordingly, the conductive domain walls at the interfaces among the first lithium niobate material layer 111, the second lithium niobate material layer 113, and the third lithium niobate material layer 115 have a better conductivity. The impurity ion can be a non-metal ion or a metal ion. The non-metal ion can be a hydrogen ion or a nitrogen ion. The metal ion can be an erbium ion, a zinc ion, an iron ion, a tin ion or a magnesium ion. It can be understood that the impurity ion is not limited to the aforementioned non-metal ion or metal ion, as long as the impurity ion can improve the conductivity of the conductive domain wall of the lithium niobate material. In an embodiment, the impurity ion can be a metallic magnesium ion.

In an embodiment, the materials of the first lithium niobate material layer 111, the second lithium niobate material layer 113, and the third lithium niobate material layer 115 can be X-cut magnesium doped lithium niobate or Y-cut magnesium doped lithium niobate. The first direction and the second direction are both perpendicular to a plane defined by the X-axis or the Y-axis. That is, the first direction and the second direction are the same as or opposite to a Z-axis direction in a coordinate system where the X-axis and the Y-axis are located.

In an embodiment of the present disclosure, a lithium niobate semiconductor device is further provided, which includes the substrate 130, a lithium niobate material film 110 fitted to the surface of the substrate, and the first electrode layer 122 and the second electrode layer 124 spaced apart from each other on the surface of the lithium niobate material film 110. The lithium niobate material film 110 includes the first lithium niobate material layer 111, the second lithium niobate material layer 113 and the third lithium niobate material layer 115.

The first lithium niobate material layer 111 is fitted to the surface of the substrate 130. The polarization direction of the ferroelectric domain of the first lithium niobate material layer 111 is the first direction. The second lithium niobate material layer 113 is fitted to the surface of the substrate 130. The second lithium niobate material layer 113 and the first lithium niobate material layer 111 are spaced apart from each other. The polarization direction of the ferroelectric domain of the second lithium niobate material layer is the first direction. The third lithium niobate material layer 115 is fitted to the surface of the substrate 130. The third lithium niobate material layer 115 is sandwiched between the first lithium niobate material layer 111 and the second lithium niobate material layer 113. The polarization direction of the ferroelectric domain of the third lithium niobate material layer 115 is the second direction. The first direction is opposite to the second direction. The third lithium niobate material layer 115 is adjacent to and connected to two conductive domain wall layers spaced apart from and opposite to each other which are in contact with the first lithium niobate material layer 111 and the second lithium niobate material layer 113 respectively.

Figure 2:
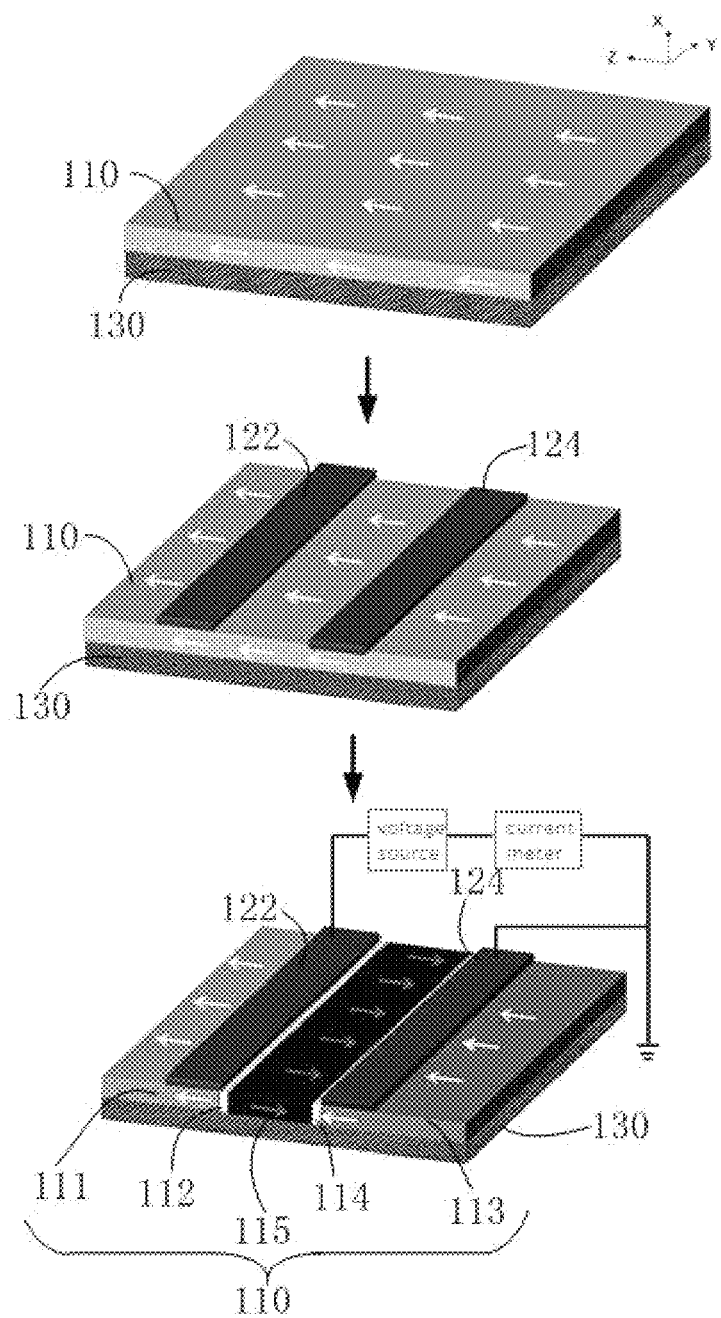
FIG. 2 is a flow chart showing a method for manufacturing a semiconductor structure according to an embodiment of the present disclosure.

Referring to FIG. 2, the present disclosure further provides a method for manufacturing a lithium niobate semiconductor structure, which includes the following steps.

S100: a lithium niobate material film 110 is provided, and a polarization direction of a ferroelectric domain of the lithium niobate material film 110 is a first direction.

S200: a first electrode layer 122 and a second electrode layer 124 spaced apart from each other are provided on a surface of the lithium niobate material film 110.

S300: a voltage is applied to the first electrode layer 122 and the second electrode layer 124, so that a polarization direction of a ferroelectric domain of the lithium niobate material film 110 between the first electrode layer 122 and the second electrode layer 124 is reversed to a second direction; the second direction is opposite to the first direction.

It should be understood that although the various steps in the flow chart of FIG. 2 are displayed in sequence as indicated by the arrows, these steps are not definitely executed in sequence in the order indicated by the arrows. Unless there is a clear description in this article, there is no strict order for the execution of these steps, and these steps can be executed in other orders. Moreover, at least part of the steps in FIG. 2 may include multiple steps or multiple stages. These steps or stages are not definitely executed at the same time, but can be executed at different time, and the order of execution of these steps or stages is not definitely performed sequentially either, but may be performed in turns or alternately with other steps or at least a part of the steps or stages in other steps.

In the step S100, the lithium niobate material film 110 has a single domain structure and can be provided on the surface of the substrate 130. The substrate 130 provides a support for the lithium niobate material film 110. It can be appreciated that the lithium niobate material film 110 can also be doped with impurity ions. The impurity ion can be a metal ion, such as erbium, zinc, iron, tin, magnesium, and the like. In an embodiment, the impurity ion is a magnesium ion. The lithium niobate material film 110 is a magnesium-doped lithium niobate single-domain crystal film. The thickness of the lithium niobate material film 110 is 50 nanometers to 1000 nanometers. In an embodiment, the thickness of the lithium niobate material film 110 is 600 nanometers. The lithium niobate material film 110 may be an X-cut lithium niobate film or a Y-cut lithium niobate film. The polarization direction of the ferroelectric domain in the lithium niobate material film 110 extends in the first direction.

In the step S200, the first electrode layer 122 and the second electrode layer 124 are spaced apart from each other and formed on the surface of the lithium niobate material film 110 away from the substrate 130. The materials of the first electrode layer 122 and the second electrode layer 124 can be a metal. The materials of the first electrode layer 122 and the second electrode layer 124 can be a precious metal, such as one of gold, silver, chromium, and palladium. The thicknesses of the first electrode layer 122 and the second electrode layer 124 are 50 nanometers to 800 nanometers.

It can be appreciated that the shapes of the first electrode layer 122 and the second electrode layer 124 are not limited, as long as they are spaced apart from and opposite to each other and an electric field can be formed between them. In an embodiment, the first electrode layer 122 and the second electrode layer 124 are stripe films. The first electrode layer 122 and the second electrode layer 124 can be formed on the surface of the lithium niobate material film 110 away from the substrate 130 by various film coating techniques. In an embodiment, the first electrode layer 122 and the second electrode layer 124 can be formed on the surface of the lithium niobate material film 110 away from the substrate 130 by magnetron sputtering process. In an embodiment, the materials of the first electrode layer 122 and the second electrode layer 124 are both metallic chromium, and the thickness is 500 nanometers.

Figure 3:
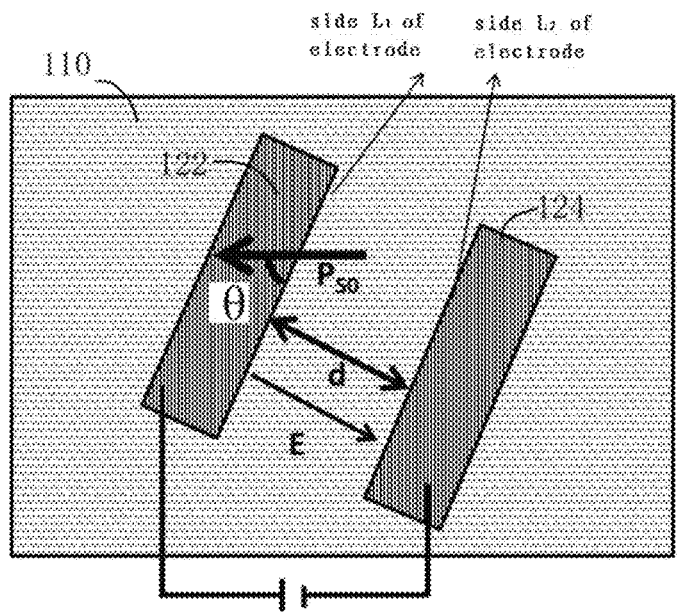
FIG. 3 is a schematic diagram of an electric field configuration when a voltage is applied in a method for manufacturing a semiconductor structure according to an embodiment of the present disclosure.

In the step S300, referring to FIG. 3, in an embodiment, the first electrode layer 122 and the second electrode layer 124 are two rectangular metal films spaced apart from each other on the surface of the lithium niobate material film 110. By applying a voltage to the first electrode layer 122 and the second electrode layer 124, a poling electric field is formed between the first electrode layer 122 and the second electrode layer 124.

In FIG. 3, a distance between the first electrode layer 122 and the second electrode layer 124 is d. The poling electric field between the first electrode layer 122 and the second electrode layer 124 is E. In FIG. 3, a direction of the poling electric field E (indicated by the arrow in the figure) is shown. The $P_{S0}$ in the figure is the polarization direction (the first direction) of the ferroelectric domain in the lithium niobate material film 110.

The first electrode layer 122 and the second electrode layer 124 are both rectangular films. The direction of the poling electric field E is from the long side $L_1$ of the first electrode layer 122 to the long side $L_2$ of the second electrode layer 124. In order to enable the poling electric field E to have a component in an opposite direction to the $P_{S0}$, the first electrode layer 122 and the second electrode layer 124 have a first inclination angle θ with respect to the direction of the $P_{S0}$. A range of the first inclination angle θ is greater than 0 degree, and less than or equal to 90 degrees. There is also a second included angle between the poling electric field and the first direction. A range of the second included angle is greater than 90 degrees, and less than or equal to 180 degrees. Therefore, the poling electric field can reverse the polarization direction of the ferroelectric domain of the lithium niobate material film 110 between the first electrode layer 122 and the second electrode layer 124 to the second direction. The second direction is opposite to the first direction.

Figure 4:
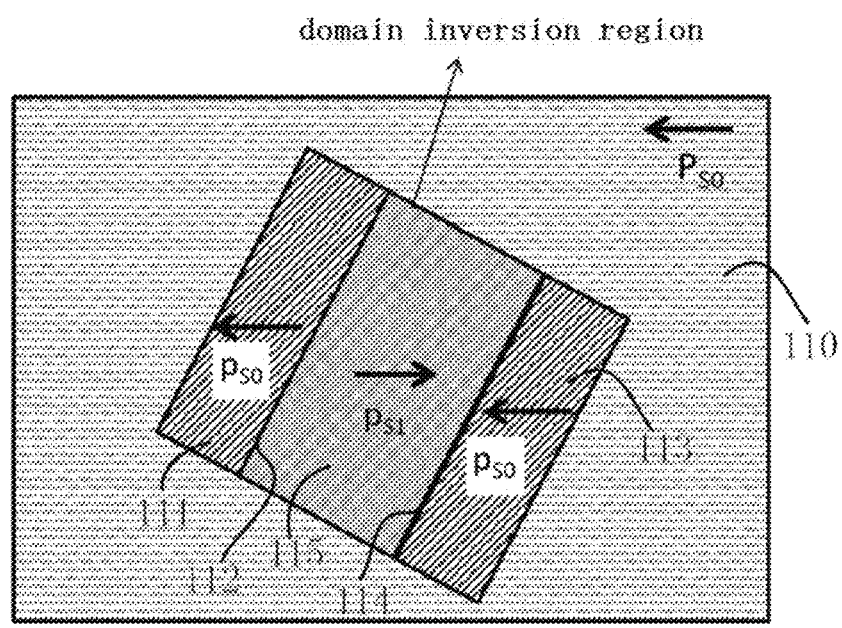
FIG. 4 is a schematic diagram of domain inversion after a voltage is applied in a method for manufacturing a semiconductor structure according to an embodiment of the present disclosure.

Referring to FIG. 4, after the polarization direction of the ferroelectric domain of the lithium niobate material film 110 between the first electrode layer 122 and the second electrode layer 124 is reversed, the lithium niobate material film 110 can be divided into five portions.

A first portion is the lithium niobate material film 110 covered by the first electrode layer 122. The first portion forms the first lithium niobate material layer 111. A second portion is the lithium niobate material film 110 covered by the second electrode layer 124. The second portion forms the second lithium niobate material layer 113. A third portion is the lithium niobate material film 110 between the first electrode layer 122 and the second electrode layer 124. The third portion forms the third lithium niobate material layer 115.

The polarization direction of the ferroelectric domain in the first lithium niobate material layer 111 is the first direction as indicated by $P_{S0}$. The polarization direction of the ferroelectric domain in the second lithium niobate material layer 113 is the first direction as indicated by $P_{S0}$. The polarization direction of the ferroelectric domain in the third lithium niobate material layer 115 is the second direction as indicated by $P_{S1}$. The third lithium niobate material layer 115 is a domain inversion region.

A fourth portion is the first conductive domain wall layer 112. The first conductive domain wall layer 112 is formed at an interface between the first lithium niobate material layer 111 and the third lithium niobate material layer 115. The first conductive domain wall layer 112 is fitted to the long side of the first electrode layer 122. A fifth portion is the second conductive domain wall layer 114. The second conductive domain wall layer 114 is formed at an interface between the third lithium niobate material layer 115 and the second lithium niobate material layer 113. The second conductive domain wall layer 114 is fitted to the long side of the second electrode layer 122. The first conductive domain wall layer 112 is a p-type conductive domain wall. The second conductive domain wall layer 114 is an n-type conductive domain wall. The lithium niobate semiconductor structure 100 can form a pn junction as a basic structure in a semiconductor device.

Therefore, the lithium niobate semiconductor structure 100 can be formed in the lithium niobate material film 110 through the above method.

It can be appreciated that a width of the domain inversion region is determined by the distance d between the first electrode layer 122 and the second electrode layer 124 in FIG. 3. In other words, the width of the third lithium niobate material layer 115 is determined by the distance d between the first electrode layer 122 and the second electrode layer 124. The distance d between the first electrode layer 122 and the second electrode layer 124 ranges from 20 nanometers to 10 micrometers. It can be understood that when the semiconductor structure 100 is a PIN photovoltaic device, the distance d ranges from 1 micrometer and 10 micrometers. In an embodiment, the distance d between the first electrode layer 122 and the second electrode layer 124 is 6.5 micrometers.

It can be appreciated that the lengths of the first conductive domain wall layer 112 and the second conductive domain wall layer 114 can be designed according to actual needs. The lengths of the first conductive domain wall layer 112 and the second conductive domain wall layer 114 can be adjusted by adjusting the lengths of the first electrode layer 122 and the second electrode layer 124. The depths of the first conductive domain wall layer 112 and the second conductive domain wall layer 114 can be the same as the thickness of the lithium niobate material film 110. The depths of the first conductive domain wall layer 112 and the second conductive domain wall layer 114 can be implemented by controlling the magnitude and duration of the voltage applied to the first electrode layer 122 and the second electrode layer 124.

In the step S300, the voltage applied to the first electrode layer 122 and the second electrode layer 124 can be a pulsed voltage. The first electrode layer 122 can be connected to a positive electrode probe. The second electrode layer 124 can be connected to a negative electrode probe. During the implementation, the pulsed voltage can be applied to the first electrode layer 122 and the second electrode layer 124 through the positive electrode probe and the negative electrode probe.

One period of the pulsed voltage can be divided into three stages. In a first stage, the pulsed voltage first rises to a stable value with time, which can prevent the instantaneous high voltage from damaging the lithium niobate material film 110. The second stage is a nucleation and coalescing stage of the lithium niobate domains in the lithium niobate material film 110, and the magnitude of the electric field formed by the pulsed voltage is above a threshold electric field $E_c$ required by the domain inversion. Such pulsed voltage can cause the ferroelectric domains in the lithium niobate material film 110 to nucleate, and under the continuous application of the pulsed voltage the nucleated ferroelectric domains further grow and coalesce in the second stage. The third stage is a stabilization stage of the ferroelectric domain in the lithium niobate material film 110. The pulsed voltage in the third stage is lower than the inversion threshold voltage, so that a built-in electric field in the inversion domain region can be balanced with the electric field established by the surface or injected screening charges in time, so that the polarization direction of the ferroelectric domain in the lithium niobate material layer 115 maintains the second direction after the domain inversion.

In the step S300, a voltage is applied to the first electrode layer 122 and the second electrode layer 124 so that the ferroelectric domain in the lithium niobate material film 110 between the first electrode layer 122 and the second electrode layer 124 undergoes the polarization reversion, an excessively high voltage may cause damage to the first electrode layer 122 and the second electrode layer 124. So, the process can be started with a smaller voltage, and then the voltage is gradually increased until a polarization current appears. Specifically, the piezoresponse force microscopy (PFM) image can be utilized to determine whether the domain inversion region is completely inverted. If it is not completely reversed, the above steps can be repeated to apply more and larger voltages.

Figure 5:
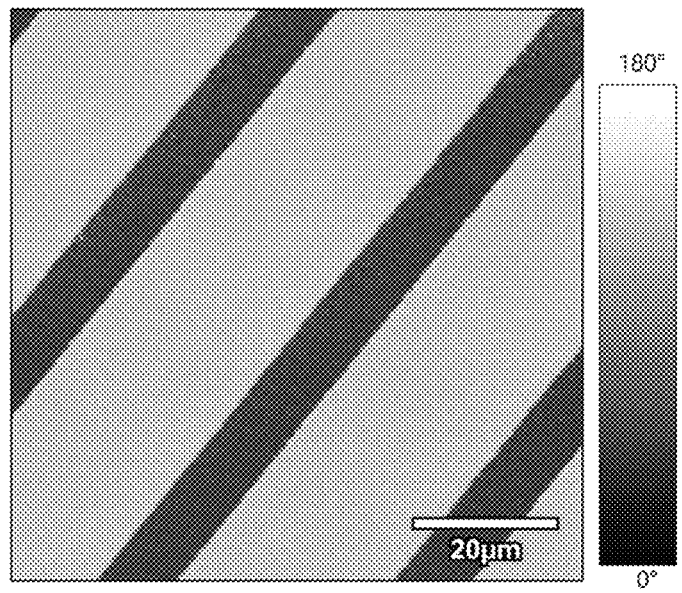
FIG. 5 is a phase diagram obtained by performing a piezoresponse force microscopy test on a ferroelectric domain structure of a semiconductor structure by using an atomic force microscope according to an embodiment of the present disclosure.
Figure 6:
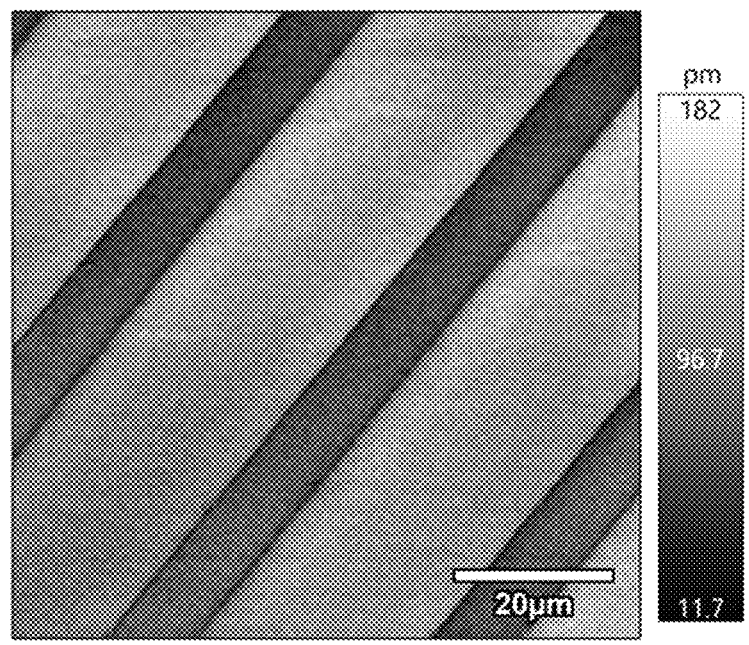
FIG. 6 is an amplitude diagram obtained by performing a piezoresponse force microscopy test on a manufactured domain structure by using an atomic force microscope according to an embodiment of the present disclosure.

In order to ensure that the ferroelectric domain of the lithium niobate crystal in the lithium niobate material film 110 between the first electrode layer 122 and the second electrode layer 124 is reversed, an atomic force microscope can be adopted to perform a PFM image test on the distribution of the ferroelectric domain of the lithium niobate material film 110. In this embodiment, the angle between the long side of the first electrode layer 122 and the $P_{S0}$, and the angle between the long side of the second electrode layer 124 and the $P_{S0}$ are both 45°. The specific test results are shown in FIGS. 5-6, and it can be seen from FIG. 5 that a phase difference between the inversion domain region and an adjacent domain is 180°. FIG. 6 shows that the conductive domain wall (the first conductive domain wall layer 112 or the second conductive domain wall layer 114) at an interface of domains is flat and perpendicular to the surface of the substrate 130. An angle between the conductive domain wall and the polarization direction is also 45°. The conductive domain wall is fitted to the long side of the first electrode layer 122, and a morphology of the conductive domain wall is determined by a morphology of the long side of the first electrode layer 122.

Figure 7:
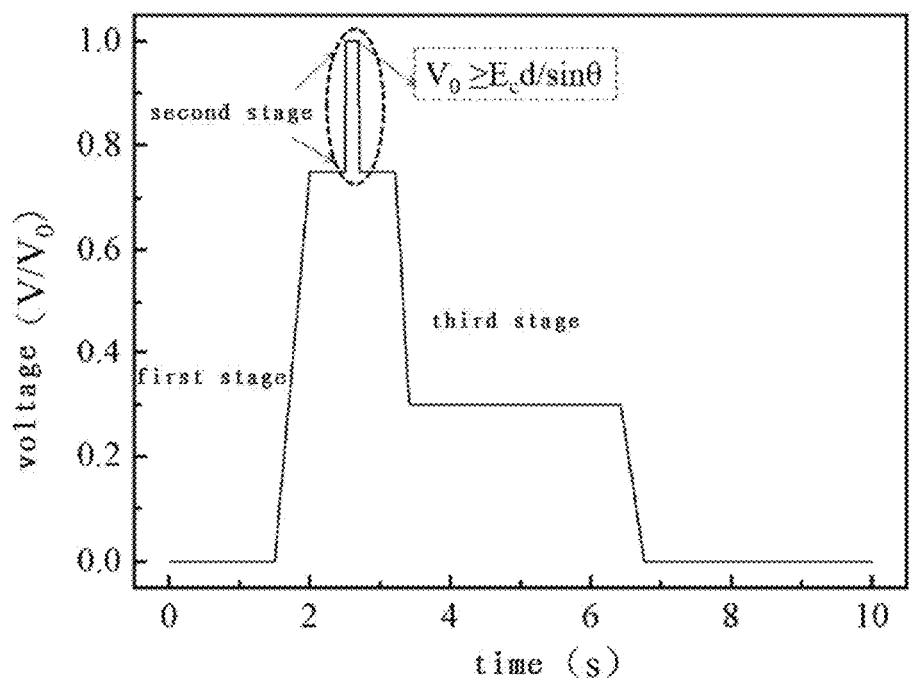
FIG. 7 is a waveform diagram of a voltage pulse applied in manufacturing a semiconductor structure according to an embodiment of the present disclosure.

Referring to FIG. 7, in some embodiments, a duration of one period of the pulsed voltage is 10 s. As shown in FIG. 7, a peak voltage reference value $V_0$ is set first. The peak voltage reference value $V_0$ is greater than or equal to $E_c d/\sin\theta$, and the threshold poling electric field $E_c$ is equal to 40 kV/mm. The variable V is a value of a voltage between the first electrode layer 122 and the second electrode layer 124. In the first stage, the pulsed voltage gradually increases from 0V to the first stable voltage value $V_1$, and a magnitude thereof satisfies that $V_1/V_0$ equal to 75%. In the second stage, the pulsed voltage continues to increase to the second stable voltage value $V_0$. After maintaining for a period of time, the pulsed voltage begins to decrease gradually, and then enters the third stage. In the third stage, the pulsed voltage continues to stabilize at a third stable voltage value $V_2$, the magnitude thereof satisfies that $V_2/V_0$ is in the range from 30% to 75%. In an embodiment, when the lithium niobate semiconductor structure 100 is manufactured, the pulsed voltage can be applied to the first electrode layer 122 and the second electrode layer 124 for 10 to 20 periods.

Figure 8:
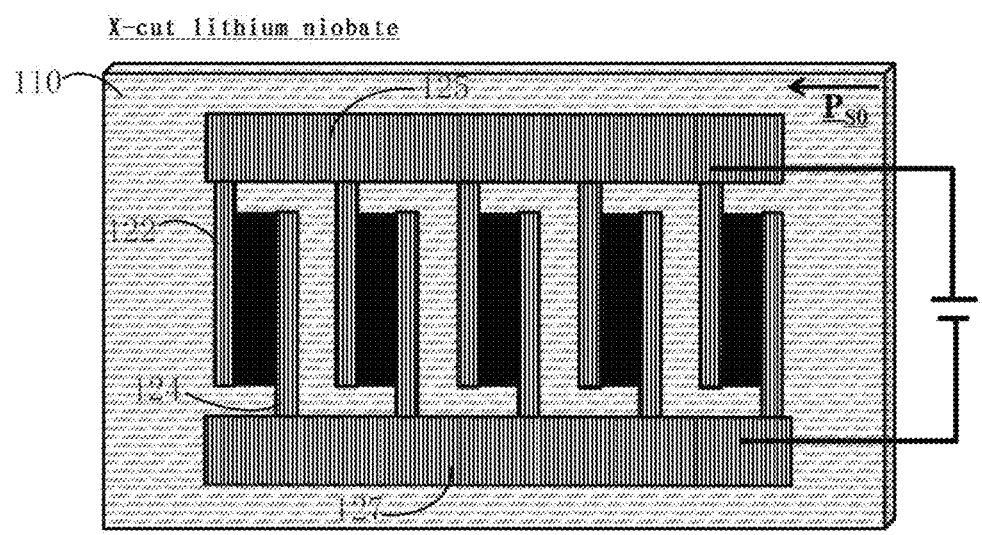
FIG. 8 is a flow chart showing a method for manufacturing a semiconductor structure according to an embodiment of the present disclosure.

Referring to FIG. 8, in an embodiment of the present disclosure, a method for manufacturing a lithium niobate semiconductor structure 100 is provided, which specifically includes the following steps.

S100: a lithium niobate material film 110 is provided, a polarization direction of a ferroelectric domain of the lithium niobate material film 110 is a first direction.

S200: a plurality of first electrode layers 122 and a plurality of second electrode layers 124 spaced apart are provided on a surface of the lithium niobate material film 110;

S300: a voltage is applied to the first electrode layer 122 and the second electrode layer 124, so that the polarization direction of the ferroelectric domain of the lithium niobate material film 110 between a first electrode layer 122 and a second electrode layer 124 which are adjacent is reversed to a second direction; the second direction is opposite to the first direction.

The method for manufacturing the lithium niobate semiconductor structure 100 in this embodiment is similar to the method for manufacturing the lithium niobate semiconductor structure 100 in the embodiment of FIG. 2. A difference lies in that in this embodiment, a plurality of first electrode layers 122 and a plurality of second electrode layers 124 spaced apart are provided on the lithium niobate material film 110. Through the plurality of first electrode layers 122 and the plurality of second electrode layers 124, a plurality of lithium niobate semiconductor structures 100 can be manufactured at once.

In an embodiment, the lithium niobate material film 110 is an X-cut magnesium-doped (5 mol %) lithium niobate single-domain crystal film. The thickness of the lithium niobate single-domain crystal film in the X direction is 600 nanometers. Specifically, the substrate 130 is formed by stacking a $SiO_2$ film with a thickness of 2 micrometers and a lithium niobate crystal sheet with a thickness of 500 micrometers. The lithium niobate crystal sheet with the thickness of 500 micrometers is provided on a first surface of the $SiO_2$ film with the thickness of 2 micrometers. The $SiO_2$ film with the thickness of 2 micrometers also has a second surface spaced apart from and opposite to the first surface. An X-cut lithium niobate single-domain crystal film layer with a thickness of 600 nanometers is stacked on the second surface. The X-cut lithium niobate single-domain crystal film layer with the thickness of 600 nanometers is the lithium niobate material film 110. An area of the lithium niobate material film 110 satisfies Y×Z=10 mm×10 mm.

In the step S200, a first auxiliary electrode layer 125 and a second auxiliary electrode layer 127 which are spaced apart from each other can be formed on the surface of the lithium niobate material film 110 by photolithography or magnetron sputtering technology. The thicknesses of the first auxiliary electrode layer 125 and the second auxiliary electrode layer 127 range from 300 nm to 500 nm. The first auxiliary electrode layer 125 and the second auxiliary electrode layer 127 can be straight long-side positive and negative chromium electrodes. A plurality of pairs of the first electrode layer 122 and the second electrode layer 124 spaced apart are provided between the first auxiliary electrode layer 125 and the second auxiliary electrode layer 127. The plurality of first electrode layers 122 and the plurality of second electrode layers 124 can form interdigital electrodes. Each first electrode layer 122 and each second electrode layer 124 have a length of 100 micrometers and a width of 5 micrometers. An angle between a straight long side of each first electrode layer 122 and the first direction is 90 degrees; and an angle between a straight long side of each second electrode layer 124 and the first direction is 90 degrees. In each pair of the first electrode layer 122 and the second electrode layer 124, a distance between the first electrode layer 122 and the second electrode layer 124 is 6.5 micrometers.

The voltage signal can be generated by a signal generator (Agilent 33120A), and amplified by a high-voltage amplifier (TREK20/20C-H-CE-EX), and then loaded onto each pair of the first electrode layer 122 and the second electrode layer 124 through metal probes. The loaded voltage signal can be a pulsed voltage as shown in FIG. 7. A complete voltage pulse waveform has a duration of 10 s and an effective time of 0.2 s. The direction of the applied electric field is antiparallel to an initial spontaneous polarization direction of the lithium niobate single-domain crystal film. An angle between the conductive domain wall and the spontaneous polarization direction is 90°. The peak of the pulsed voltage, from 120 V above, is applied, and a poling current appears when the peak of the pulsed voltage is gradually increased to 280 V. In order to shorten the inversion time, the peak voltage can be increased to 360 V, and then a dozen of same pulsed voltages can be applied to complete the polarization inversion of the ferroelectric domain of the lithium niobate single-domain crystal film in the region between each pair of the first electrode layer 122 and the second electrode layer 124. Through the above manner, the lithium niobate semiconductor structure 100 can be manufactured, that is, a lithium niobate pn junction based on a lithium niobate conductive domain wall.

In order to further test the conductivity characteristics of the first conductive domain wall layer 112 and the second conductive domain wall layer 114 in the lithium niobate semiconductor structure 100, the electrode layers of a manufactured sample used during the poling process can be removed, and the positive and negative chromium test electrodes with a thickness of 300 nanometers are re-plated by using the photolithography and magnetron sputtering technology. The positive and negative chromium test electrodes are coated on the first conductive domain wall layer 112 or the second conductive domain wall layer 114, and are perpendicular to the first conductive domain wall layer 112 or the second conductive domain wall layer 114.

The test voltage signal (provided by a KeithleyA ammeter) is loaded on the positive and negative chromium test electrodes via metal probes. In order to be able to detect a large current signal, the distance between the positive and negative chromium test electrodes is 6.5 micrometers. The KeithleyA ammeter serves as a current measuring device with a measurement accuracy of 0.01 pA. The measured conductivity of the first conductive domain wall layer 112 (p-type conductive domain wall, θ=90°, "tail-to-tail" conductive domain wall) is on an order of $10^{-6}$ $\Omega^{-1}$ $cm^1$. The conductivity of the second conductive domain wall layer 114 (n-type conductive domain wall, θ=90°, "head-to-head" conductive domain wall) is on an order of $10^{-4}$ $\Omega^{-1}$ $cm^{-1}$.

It can be appreciated that the first conductive domain wall layer 112 in the lithium niobate material film 110 is connected to the first electrode layer 122, and the second conductive domain wall layer 114 in the lithium niobate material film 110 is connected to the second electrode layer 124. During the test, the first electrode layer 122 and the second electrode layer 124 can also be directly used as test electrodes of the pn junction.

Figure 9:
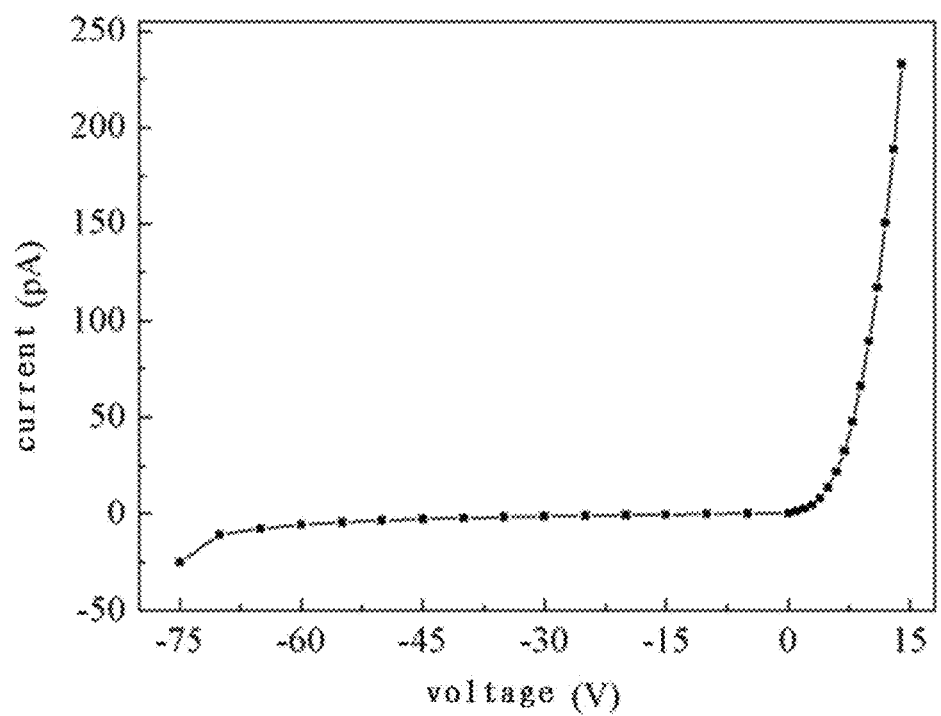
FIG. 9 is an I-V rectification characteristic curve of a semiconductor structure according to an embodiment of the present disclosure.

Referring to FIG. 9, which shows a test I-V curve of multiple sets of pn junctions manufactured in the embodiment of FIG. 8. When the p-type conductive domain wall is connected to a positive pole of the power supply and the n-type conductive domain wall is connected to the negative pole of the power supply, the pn junction is in a forward conduction state, and the current increases exponentially with the voltage. Conversely, when the n-type conductive domain wall is connected to the positive pole of the power supply and the p-type conductive domain wall is connected to the negative pole of the power supply, the pn junction is in a reverse cut-off state, and almost no current flows. The measured I-V test curve shows typical pn junction rectifying characteristics. When the reverse voltage is larger than 70 V, the current can increase sharply and the pn junction may be destroyed.

Those skilled in the art can easily understand that the above embodiments are merely the preferred embodiments of the present disclosure and are not intended to limit the present disclosure. Any modification, equivalent replacement and improvement, etc., made within the spirit and principle of the present disclosure should be included in the protection scope of the present disclosure.

The technical features of the above-mentioned embodiments can be combined arbitrarily. In order to make the description concise, all possible combinations of the various technical features in the above-mentioned embodiments are not described. However, as long as there is no contradiction in the combination of these technical features, all should be considered as the scope of the present disclosure.

The above-mentioned embodiments are merely several exemplary embodiments of the present disclosure, and the descriptions are more specific and detailed, but they should not be interpreted as limiting the scope of the disclosure. It should be pointed out that those of ordinary skill in the art can make several modifications and improvements without departing from the concept of the present disclosure, and these all fall within the protection scope of the present disclosure. Therefore, the protection scope of the present disclosure should be subject to the appended claims.

The various embodiments in this specification are described in a progressive manner. Each embodiment focuses on the differences from other embodiments, and the same or similar parts between the various embodiments can be referred to each other.

The foregoing description of the disclosed embodiments enables those skilled in the art to implement or use this disclosure. Various modifications to these embodiments will be apparent to those skilled in the art, and the general principles defined herein can be implemented in other embodiments without departing from the spirit or scope of the present disclosure. Therefore, this disclosure will not be limited to the embodiments shown herein, but should conform to the widest scope consistent with the principles and novel features disclosed herein.

What is claimed is:

1. A lithium niobate semiconductor structure, comprising:
   a first lithium niobate material layer, a polarization direction of a ferroelectric domain of the first lithium niobate material layer being a first direction;
   a second lithium niobate material layer, spaced apart from the first lithium niobate material layer, and a polarization direction of a ferroelectric domain of the second lithium niobate material layer being the first direction;
   a third lithium niobate material layer, sandwiched between the first lithium niobate material layer and the second lithium niobate material layer, and a polarization direction of a ferroelectric domain of the third lithium niobate material layer being a second direction, the first direction being opposite to the second direction;
   a first conductive domain wall layer, provided between the first lithium niobate material layer and the third lithium niobate material layer; and
   a second conductive domain wall layer, provided between the second lithium niobate material layer and the third lithium niobate material layer, carriers of the first conductive domain wall layer have an opposite polarity to carriers of the second conductive domain wall layer.

2. The lithium niobate semiconductor structure according to claim 1, further comprising:
   a first electrode layer, covering the first lithium niobate material layer and adjacent to the first conductive domain wall layer;
   a second electrode layer, spaced apart from the first electrode layer, covering the second lithium niobate material layer, and adjacent to the second conductive domain wall layer.

3. The lithium niobate semiconductor structure according to claim 2, wherein the first electrode layer is electrically connected to the first conductive domain wall layer, and the second electrode layer is electrically connected to the second conductive domain wall layer.

4. The lithium niobate semiconductor structure according to claim 1, further comprising a substrate, wherein the first lithium niobate material layer, the second lithium niobate material layer, and the third lithium niobate material layer are provided on a surface of the substrate.

5. The lithium niobate semiconductor structure according to claim 4, wherein the first lithium niobate material layer, the second lithium niobate material layer and the third lithium niobate material layer each has a single-domain structure.

6. The lithium niobate semiconductor structure according to claim 1, wherein the first lithium niobate material layer, the second lithium niobate material layer and the third lithium niobate material layer are X-cut magnesium-doped lithium niobate material layers or Y-cut magnesium-doped lithium niobate material layers.

7. A lithium niobate semiconductor device, comprising:
   a substrate;
   a lithium niobate material film fitted to a surface of the substrate, the lithium niobate material film comprising:
   a first lithium niobate material layer fitted to the surface of the substrate, a polarization direction of a ferroelectric domain of the first lithium niobate material layer being a first direction;
   a second lithium niobate material layer fitted to the surface of the substrate and spaced apart from the first lithium niobate material layer, a polarization direction of a ferroelectric domain of the second lithium niobate material layer being the first direction;
   a third lithium niobate material layer fitted to the surface of the substrate and sandwiched between the first lithium niobate material layer and the second lithium niobate material layer, a polarization direction of a ferroelectric domain of the third lithium niobate material layer being a second direction, and the first direction being opposite to the second direction;
   wherein the third lithium niobate material layer is in contact with and electrically connected to two conductive domain wall layers spaced apart from and opposed to each other, the two conductive domain wall layers being respectively in contact with the first lithium niobate material layer and the second lithium niobate material layer;
   a first conductive domain wall layer, provided between the first lithium niobate material layer and the third lithium niobate material layer; and
   a second conductive domain wall layer, provided between the second lithium niobate material layer and the third lithium niobate material layer, the carriers of the first conductive domain wall layer have an opposite polarity to the carriers of the second conductive domain wall layer.

8. The lithium niobate semiconductor structure according to claim 7, further comprising:
   a first electrode layer, covering the first lithium niobate material layer and adjacent to the first conductive domain wall layer;
   a second electrode layer, spaced apart from the first electrode layer, covering the second lithium niobate material layer, and adjacent to the second conductive domain wall layer.

9. The lithium niobate semiconductor structure according to claim 8, wherein the first electrode layer is electrically connected to the first conductive domain wall layer, and the second electrode layer is electrically connected to the second conductive domain wall layer.

10. The lithium niobate semiconductor device according to claim 7, wherein the first lithium niobate material layer, the second lithium niobate material layer and the third lithium niobate material layer are formed by one complete lithium niobate material film.

11. The lithium niobate semiconductor device according to claim 7, wherein the lithium niobate material film has a single-domain structure.

* * * * *